United States Patent

Bohn

[11] Patent Number: 5,554,956
[45] Date of Patent: Sep. 10, 1996

[54] OTHOGONAL INSERTION PHASE TUNING METHOD

[75] Inventor: Thomas B. Bohn, Island Lake, Ill.

[73] Assignee: Motorola, Inc., Schaumburg, Ill.

[21] Appl. No.: 608,031

[22] Filed: Feb. 28, 1996

Related U.S. Application Data

[63] Continuation-in-part of Ser. No. 301,083, Sep. 6, 1994, abandoned.

[51] Int. Cl.$^6$ .................................. H03F 3/60; H03H 7/20
[52] U.S. Cl. ........................... 330/53; 333/139; 333/160
[58] Field of Search .................................... 333/138, 139, 333/160, 161, 164; 330/2, 53, 57, 107, 286, 302, 305, 306

[56] References Cited

U.S. PATENT DOCUMENTS 3,493,853  2/1970  Bellany et al. ............................ 330/2
3,781,722  12/1973  Pierson ................................. 333/160 X

FOREIGN PATENT DOCUMENTS 0058714  3/1987  Japan ...................................... 333/139

*Primary Examiner*—Steven Mottola
*Attorney, Agent, or Firm*—Frank M. Scutch, III

[57] ABSTRACT

An orthogonal insertion phase tuning method for easily and efficiently tuning insertion phase without affecting other critical system parameters. The method is used generally with an amplifier network and includes attaching (130) at least two line runners in parallel at the input of the network. The insertion phase is then measured (140) to determine which runner most closely yields an acceptable and desired insertion phase. The remaining line runners are removed (150). An orthogonal relationship exists between insertion phase and input return loss in view of the tuning at a 50 ohm point with 50 ohm runners. This method insures only a minor change to input return loss while quickly and easily adjusting insertion phase.

7 Claims, 2 Drawing Sheets

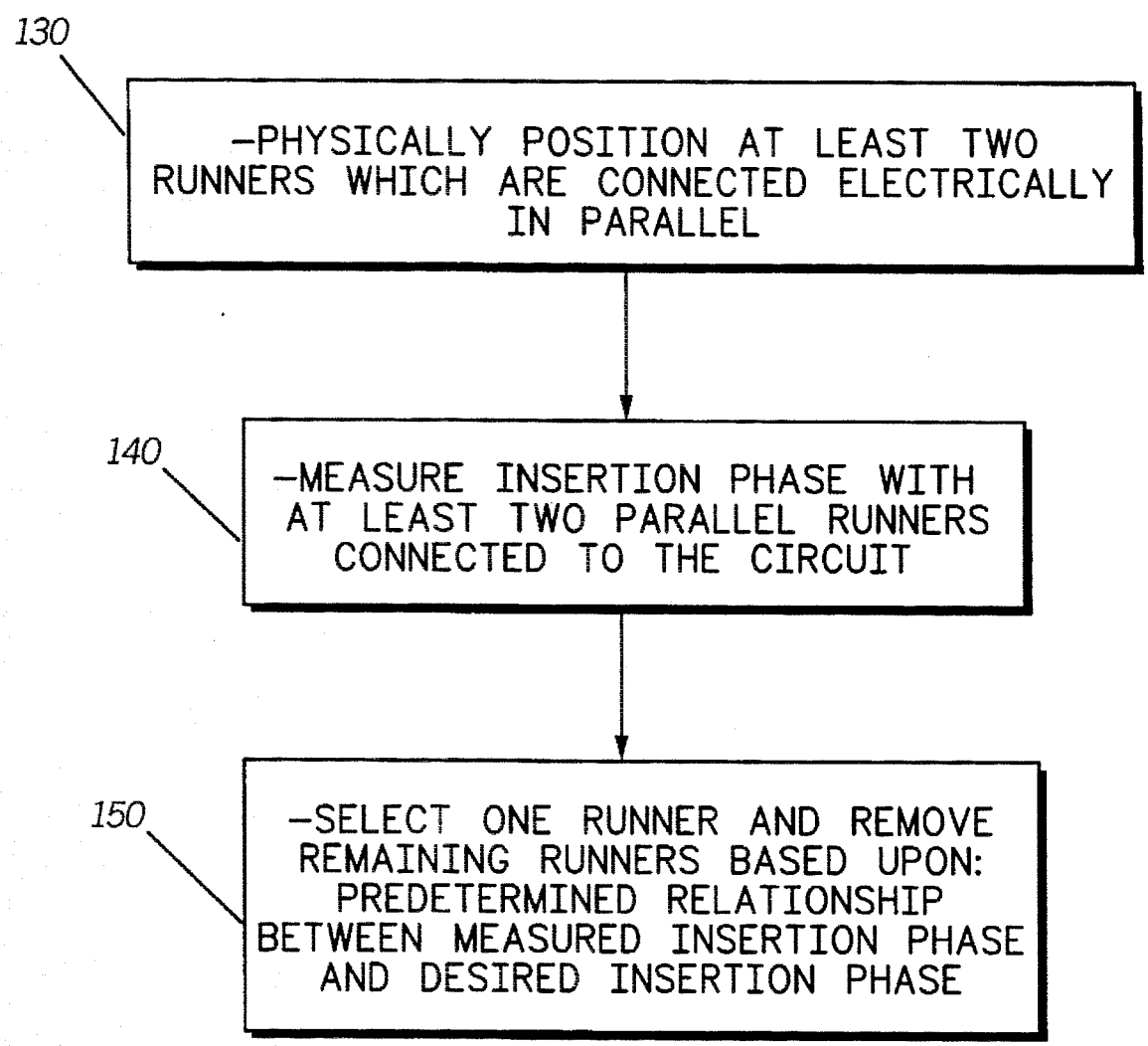

OTHOGONAL INSERTION PHASE TUNING METHOD

CROSS REFERENCE TO RELATED APPLICATIONS

This application is a continuation-in-part of now abandoned U.S. application Ser. No. 08/301,083, filed Sep. 6, 1994, by Thomas B. Bohn, entitled "ORTHOGONAL INSERTION PHASE TUNING METHOD," and assigned to Motorola, Inc.

TECHNICAL FIELD

This invention relates in general to matching networks and more particularly to a method of tuning insertion phase.

BACKGROUND

Many types of power amplifiers require the outputs of multiple power modules be combined in order to achieve output power goals. In order to maximize amplifier output power, each of the combined power modules is required to have similar insertion phase. The insertion phase varies due to both transistor parameters and matching network variations.

Presently, a module's insertion phase is most often tuned in a factory environment during manufacture. This is accomplished using a variable shorted stub and variable open stub which are separated by a quarter wavelength in a power module's input matching circuitry. Decreasing the open stub's length increases insertion phase. Conversely, increasing the shorted stub's length decreases insertion phase. However, both of these variable length stubs are part of the input matching circuitry. Depending on the manner in which they are used, they may significantly vary other critical module parameters such as input return loss. This requires lengthy and cumbersome tuning algorithms in the factory to iterate towards a simultaneous solution to compensate for changes in both insertion phase and input return loss.

Therefore the need exists for a method by which a power amplifier module may be easily tuned for the proper insertion phase. The method should be easy to implement and should not affect other critical parameters of the power amplifier module.

BRIEF DESCRIPTION OF THE DRAWINGS

FIG. 3 is a flow chart diagram using the method of the present invention.

DETAILED DESCRIPTION OF THE PREFERRED EMBODIMENT

Figure 1:
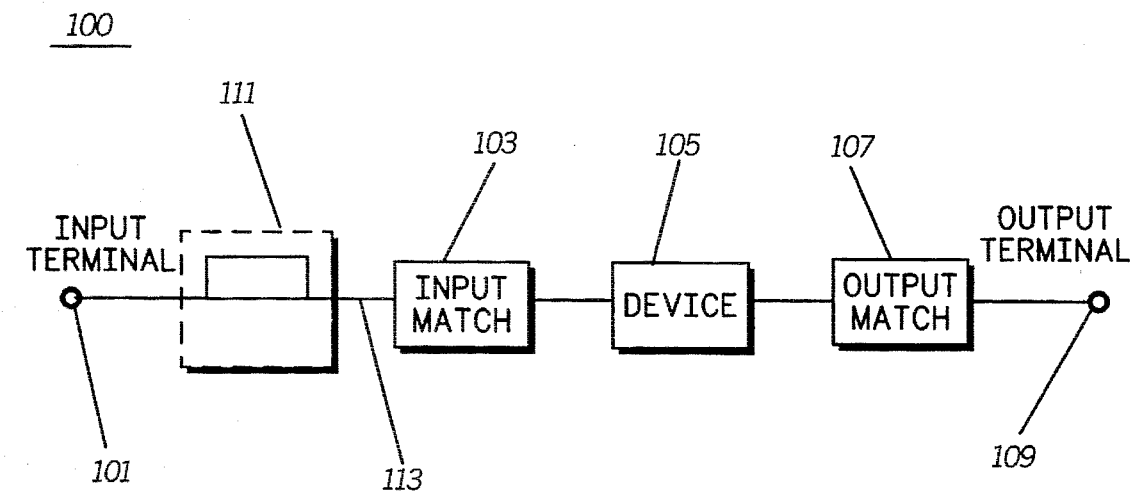
FIG. 1 is a block diagram showing the system using the method of the present invention.

Referring now to FIG. 1, the invention is shown generally as module 100. The system includes an input terminal 101 which attaches to an input matching network 103 using an input cable or runner 113. Input matching network 103 matches the input impedance of a device 105 to the source impedance applied to input terminal 101. Device 105 may be a power amplifier transistor or the like. Similarly, an output matching network 107 is used to match the output impedance of device 105 to the load impedance applied to output terminal 109.

Positioned at a convenient location between input terminal 101 and input matching network 103 is an orthogonal insertion phase tuning device 111. The source impedance at input terminal 101 is 50 ohms. In that the impedance of the input runner 113, used between the input terminal 101 and input matching network 103 is 50 ohms, orthogonal insertion phase tuning device 111 may be positioned at any location along the input runner 113.

Figure 2:
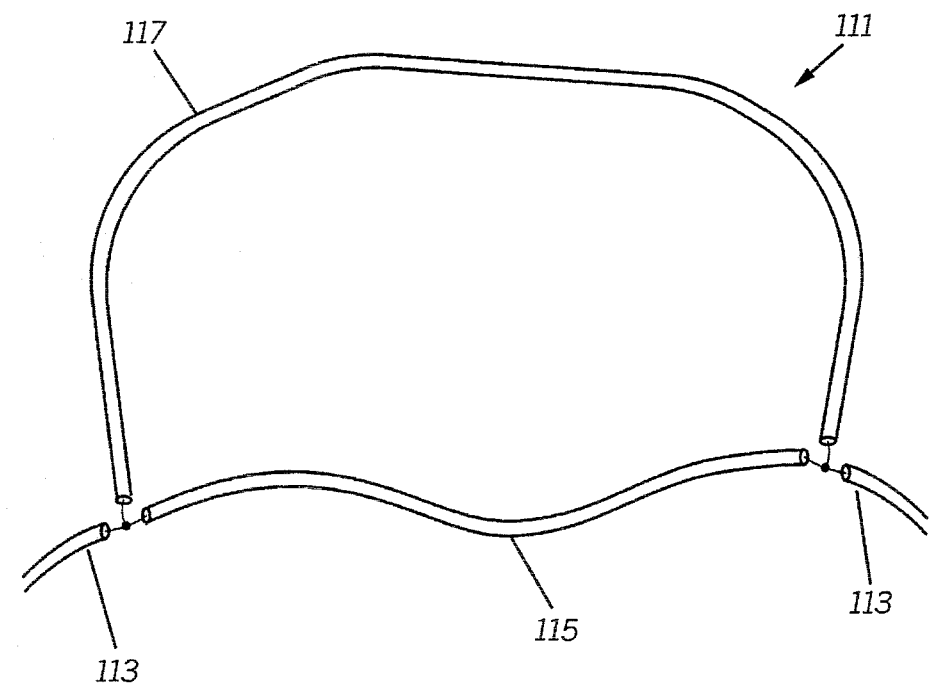
FIG. 2 is an isometric view showing the connection of parallel runners used in the method of the invention.

FIG. 2 shows an enlarged isometric view of the orthogonal insertion phase tuning device 111. The invention utilizes two parallel 50 ohm runners. Although two runners are used here, it should be recognized by those skilled in the art that two or more runners may be used. A primary runner 115 is connected in parallel with a secondary runner 117. Primary runner 115 is defined as a portion of the runner used as an input. Secondary runner 117 is physically different i.e. longer or shorter in length than input runner 115 thereby altering the phase relationship of a signal input through input terminal 101. This phase relationship determines which runner is selected for use.

Phase Relationship between Runners

The number of runners needed as well as the phase difference between the runners are a function of the module's desired final phase range i.e. the goal, and the device's phase variation range. The number of runners required for a design is given by Equation 1.

$$\text{Number of runners} = (\text{device phase variation range})/(\text{module final phase range}) \quad (1)$$

The number of runners will always rounded up to the next highest integer because there cannot be a fraction of a runner. It will be evident to those skilled in the art when the module's phase range is greater than or equal to the device phase variation range there is no need to trim. Thus, only one runner is required for the design. As the module final phase range becomes smaller or the device phase range becomes larger, the design challenge becomes more difficult and two or more runners are required.

The phase difference between runners is given by Equation 2.

$$\text{Phase difference} = (\text{device range})/(\text{Number of runners}) \quad (2)$$

In practice, each runner is responsible for changing the phase to the desired goal for a specific section in the device phase range. The length difference of each runner for the determined phase difference is bounded by transmission line theory and depends upon the medium of choice. For example, a microstrip design on a printed circuit board such as one manufactured out of fire-retarding epoxy resin/glass cloth laminate (FR-4) substrate, would require a different physical length to obtain the same phase difference between runners than a microstrip design on an alumina substrate. Therefore as is known in the art, transmission line theory equations are used to calculate the runner length difference for the specific medium of the design.

If three runners are needed in the design, the phase difference between the short runner and the middle length runner is given by the preceding equation. This is also the phase difference between the middle length runner and the longest runner. Therefore the maximum phase difference, or the phase difference between the shortest runner and the longest runner is given by Equation 3.

Maximum phase difference=(phase difference) (# of runners−1)  (3)

As can be readily seen by those skilled in the art, Equations 1, 2 and 3, in conjunction with well known transmission line theory equations, are used to determine the runner length variations in accordance with the invention.

Parallel Runners/Single Runner Phase Relationships

The relationship between the parallel runners and a single runner can be determined empirically or with a computer aided simulation tool. This is part of the design process, and once these relationships have been established, the results are used in a manufacturing environment to determine the correct runner to obtain the insertion phase goal. The following will describe how to empirically determine the phase relationships for a two runner network. This can easily be expanded for networks requiring more than two sections.

1) Measure insertion phase of module with the parallel runner network.
2) Remove the long runner and measure insertion phase of the module through the short runner.
3) Reattach the long runner, remove the short runner and measure insertion phase of the module through the long runner.

Since the insertion phase of all three possible combinations is measured, it is easy to determine the phase relationship between any two combinations. The phase difference between two parallel runners and the short runner where IPs is represented in Equation 4.

$$IPs = Kp - Ks \quad (4)$$

and the phase difference between two parallel runners and the long runner where IPl, is represented in Equation 5.

$$IPl = Kp - Kl \quad (5)$$

As well known in the art, it is relatively easy to mass produce this parallel runner circuit with very little variation to the preceding relationships. Therefore these relationships are considered constant and used to tune a module's insertion phase.

Initial Insertion Phase

The initial insertion phase, Kp, of the module when it is measured with the parallel runner configuration can be described by Equation 6 as:

$$Kp = Y + X \quad (6)$$

where Y is insertion phase of the parallel runner network and X is insertion phase of the matching networks and device. Variations in X are dominated by device variations while Y is relatively constant, therefore initial insertion phase varies due to device variations. Variations in X can be compensated for by selecting the correct runner length.

Final Insertion Phase Determination [Tuning during Manufacturer]

A module's final insertion phase, IPF, must be in a certain range in order to meet power combining requirements. Below in Equation 7, a pseudo code description of the steps required to tune the module's insertion phase is shown with a two parallel runner configuration.

(7) Measure initial insertion phase Kp;
If Kp+IPs is in final phase range;
Remove long runner
IPf=Ks+X;
Else;
Remove short runner;
IPf=Kl+X;
Endif By measuring the insertion phase of a module with the parallel runner configuration while knowing the phase relationship between either of the single runners and the parallel runners, the final insertion phase of the module can be pre-determined for either of the single runners. Hence, the correct runner is chosen the other runner is removed, and the module's insertion phase is tuned to the correct phase range.

It should be noted that the heart of the invention lies in the fact that the insertion phase will be different depending upon which runner is chosen. However, because the phase tuning network incorporates 50 ohm runners at a 50 ohm point of the input circuit, the input return loss will be the same no matter which runner is chosen. Hence, tuning insertion phase does not change the input return loss and these two module attributes are said to be orthogonal in this process.

FIG. 3 shows a flow chart using the preferred method of the present invention. In this method, the orthogonal insertion phase tuning device 111 is used to tune the insertion phase of module 100 without affecting other critical circuit parameters such as input return loss. Input return loss is defined as $10 \log_{10}(P_r/P_i)$ where $P_r$ is the power reflected at the input of the module and $P_i$ is the power incident to the input of the module. Input return loss is a "measure of goodness" of the input match. Input return loss is a "measure of goodness" of the input match. The length of a 50 ohm runner at a 50 ohm point has minimal effect on reflected power and therefore minimal effect on input return loss. Thus, the post tuning input return loss is essentially the same, no matter which runner is chosen because they only differ in length. Overall, use of this method simplifies the tuning algorithm by reducing development time as well as overall tuning time.

The steps involved in the method of the present invention are shown in FIG. 3. At least two runners are physically positioned 130 in a parallel relationship along an input runner. A portion of the input runner may act as one of the parallel runners. The runners should be physically different in length in order to provide differing phase relationship between signals input through the input runner.

Subsequently, the insertion phase of module 100 is typically measured 140 using a network analyzer or like device capable of measuring insertion phase. Based upon the phase value obtained by this measurement, only one runner is selected and a determination is made to cut away or remove 150 any remaining parallel runners. The runner which is selected is generally that one having the closest phase relationship to a desired target phase and includes either the primary runner or one of the remaining secondary runners. This has the effect of tuning the insertion phase of module 100 into a specific range. Thus, insertion phase tuning device 111 is analogous to a stretch line with two discrete positions. It will be evident to those skilled in the art that the insertion phase is changed by using physically different runner lengths. However the insertion phase with both the primary runner 115 and the secondary runner 117, which are both 50 ohms, can be related to the module's insertion phase with only one of the runners which are at least two physical lengths. A great advantage of the method of the present invention is a user knows which 50 ohm runner to choose from only one initial measurement and the predetermined phase relationships.

An additional benefit of using the insertion phase tuning method is that the input return loss of module 100 will be substantially the same no matter which 50 ohm runner is chosen. Accordingly, the method of the invention allows the input return loss of module 100 to never have to be tuned if the input match is efficient enough to meet module specifications without tuning. Moreover, since this method yields only minor changes to input return loss and major changes to insertion phase, the insertion phase tuning method yields an orthogonal relationship between input return loss and insertion phase. This orthogonal relationship exists because the tuning occurs at a 50 ohm point with 50 ohm runners. Although the runner impedance is set at 50 ohms in the above example, it should also be recognized by those skilled in the art that runners with different impedance values may be used as long as they are all the equivalent and are the same as the source impedance e.g. 75 ohms.

In another embodiment of the invention, multiple parallel lines may be used to yield a larger tuning range than methods currently used in the industry. Since current industry methods allow only for a 30–50 degree tuning range, the method of the present invention may be used to provide a 360 degree tuning range when used with multiple runners of various lengths.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A method of tuning insertion phase in an amplifier network including an amplifier module having an input line comprising the steps of:

connecting at least one runner, which is different in length, electrically in parallel with said input line to said amplifier network;

measuring the insertion phase of said amplifier module; and removing either said at least one runner or said input line based on a predetermined measured phase relationship in order to properly tune the insertion phase of said amplifier network.

2. An orthogonal phase tuning method comprising the steps of:

attaching a primary input line between an input terminal and a amplifier network;

attaching a secondary input line in parallel with said primary input line, said parallel input line being physically different in length;

measuring the insertion phase of said amplifier network;

determining a relationship between a desired insertion phase and the measured insertion phase between both said primary and secondary input lines;

removing either said primary input line or said secondary input line based on said desired phase relationship; and whereby the insertion phase of said amplifier network is changed in response to said removing step for properly adjusting the insertion phase of said network without affecting other critical amplifier network parameters.

3. A method of adjusting the insertion phase of an amplifier using a plurality of line runners comprising the steps of:

attaching a signal input line having a fixed length between an input terminal and a matching network;

connecting at least one line runner in parallel with a predetermined portion of said signal input line, said at least one line runner having a different physical length than said fixed length;

measuring the insertion phase of said amplifier;

selecting between said signal input line and said at least one runner based on a desired insertion phase value; and removing either said predetermined portion of said signal input line or said at least one line runner based on said measuring step thereby tuning the insertion phase of said amplifier.

4. A method according to claim 3 wherein said amplifier includes at least one power transistor.

5. A method according to claim 3 wherein said signal input line and said at least one line runner are the same impedance value.

6. A method according to claim 3 wherein both said signal input line and said at least one runner are 50 ohms.

7. A method according to claim 3 wherein said insertion phase is measured with a network analyzer.

* * * * *